(12) United States Patent
Palomo Lorenzo et al.

(10) Patent No.: US 11,191,180 B2
(45) Date of Patent: Nov. 30, 2021

(54) ELECTRICAL ASSEMBLY

(71) Applicant: Lear Corporation, Southfield, MI (US)

(72) Inventors: Antonio Palomo Lorenzo, Valls (ES);
Antoni Ferré Fàbregas, Valls (ES);
Carlos Fernández Pueyo, Valls (ES);
Jose Gabriel Fernández Bañares,
Valls (ES)

(73) Assignee: Lear Corporation, Southfield, MI (US)

( * ) Notice: Subject to any disclaimer, the term of this patent is extended or adjusted under 35 U.S.C. 154(b) by 43 days.

(21) Appl. No.: 16/790,030

(22) Filed: Feb. 13, 2020

(65) Prior Publication Data

US 2021/0259127 A1    Aug. 19, 2021

(51) Int. Cl.
| | |
|---|---|
| *H05K 7/00* | (2006.01) |
| *H05K 7/14* | (2006.01) |
| *H01R 9/22* | (2006.01) |
| *B60R 16/023* | (2006.01) |
| *H01R 12/70* | (2011.01) |
| *H05K 1/18* | (2006.01) |
| *H05K 1/02* | (2006.01) |
| *H05K 3/34* | (2006.01) |

(52) U.S. Cl.
CPC ......... *H05K 7/1427* (2013.01); *B60R 16/023* (2013.01); *H01R 9/22* (2013.01); *H01R 12/7088* (2013.01); *H05K 1/0263* (2013.01); *H05K 1/181* (2013.01); *H05K 1/182* (2013.01); *H05K 3/34* (2013.01); *H05K 2201/10272* (2013.01)

(58) Field of Classification Search
CPC .... H05K 7/1427; H05K 1/0263; H05K 1/181; H05K 1/182; H05K 3/34; H05K 2201/10272; B60R 16/023; H01R 9/22; H01R 12/7088
See application file for complete search history.

(56) References Cited

U.S. PATENT DOCUMENTS

| | | | |
|---|---|---|---|
| 6,359,770 B1 * | 3/2002 | Kolody | H04Q 1/10 361/626 |
| 6,699,067 B1 * | 3/2004 | Zhao | H01R 12/7088 439/516 |
| 9,457,743 B2 | 10/2016 | Soleski et al. | |
| 9,985,403 B1 * | 5/2018 | Herring | H01R 41/00 |
| 10,090,657 B2 | 10/2018 | Kobayashi et al. | |
| 2005/0057865 A1 | 3/2005 | Veloo et al. | |
| 2017/0256826 A1 | 9/2017 | Hong et al. | |

FOREIGN PATENT DOCUMENTS

| | | |
|---|---|---|
| CN | 101603645 B | 12/2009 |
| EP | 2457289 B1 | 8/2016 |

\* cited by examiner

*Primary Examiner* — Pete T Lee
(74) *Attorney, Agent, or Firm* — Fishman Stewart PLLC

(57) ABSTRACT

An electrical assembly includes a circuit board, a shunt busbar; a connector including a first conductive resilient member and a second conductive resilient member, and a controller. The first conductive resilient member and the second conductive resilient member may be disposed substantially between the circuit board and the shunt busbar. The first conductive resilient member and the second conductive resilient member may electrically connect the controller with the shunt busbar.

19 Claims, 14 Drawing Sheets

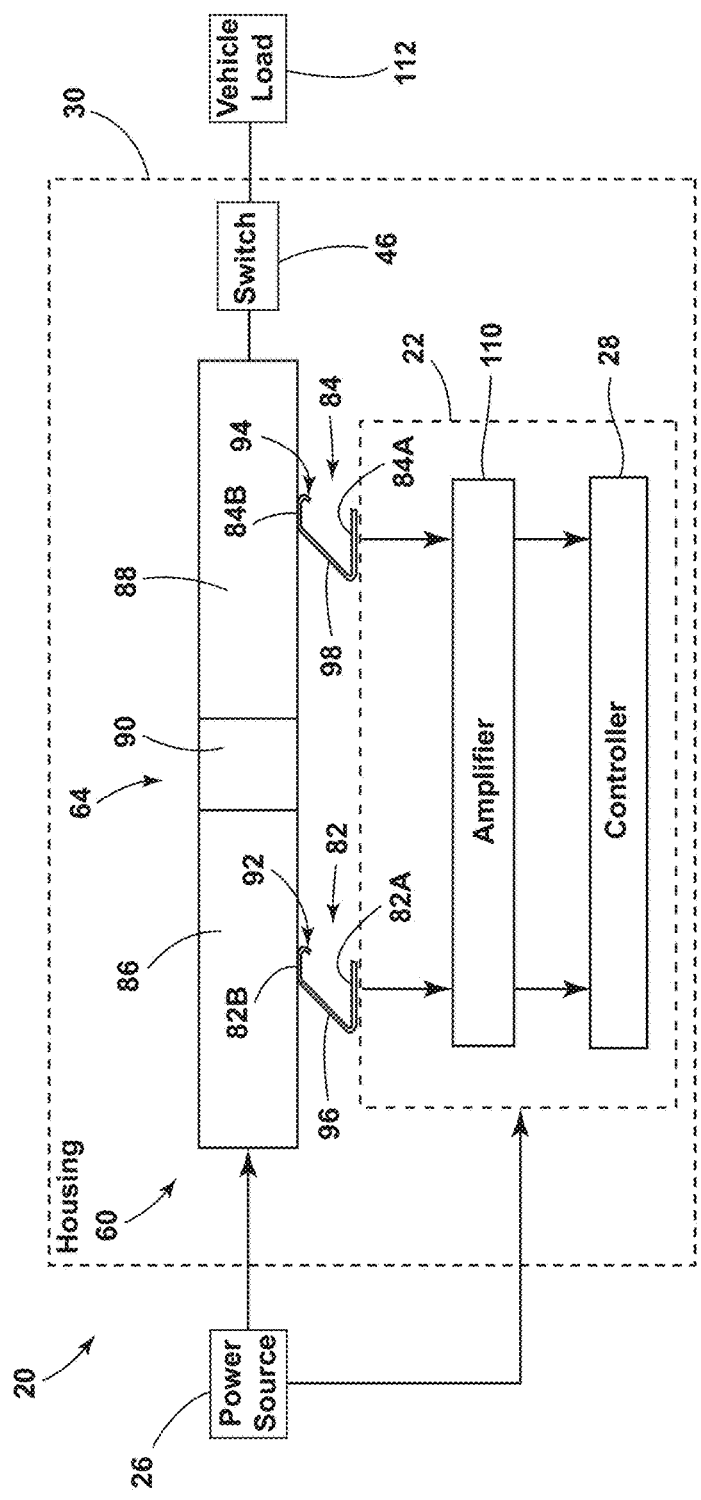
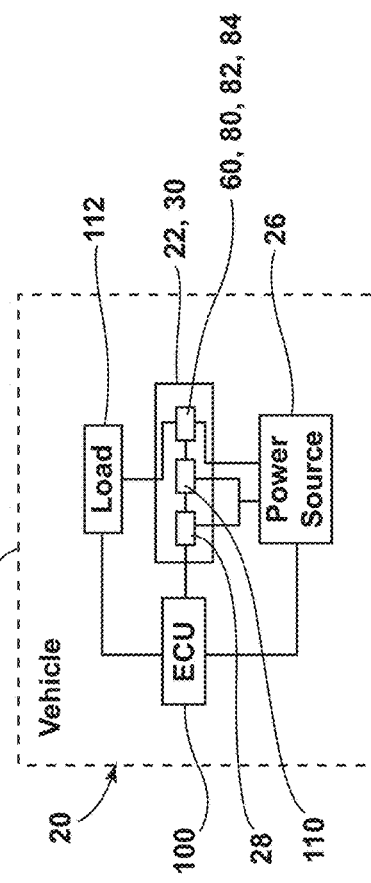
FIG. 10A
FIG. 10B

ELECTRICAL ASSEMBLY

TECHNICAL FIELD

The present disclosure generally relates to electrical assemblies, including electrical assemblies that may include components and/or that may be used in connection with vehicles.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical assemblies may be difficult and/or inefficient to assemble.

There is a desire for solutions/options that minimize or eliminate one or more challenges or shortcomings of electrical assemblies and/or components. The foregoing discussion is intended only to illustrate examples of the present field and should not be taken as a disavowal of scope.

SUMMARY

In embodiments, an electrical assembly includes a circuit board, a shunt busbar; a connector including a first conductive resilient member and a second conductive resilient member, and a controller. The first conductive resilient member and the second conductive resilient member may be disposed substantially between the circuit board and the shunt busbar. The first conductive resilient member and the second conductive resilient member may electrically connect the controller with the shunt busbar.

With embodiments, an electrical assembly may include a circuit board, a housing, a shunt busbar, a controller, and/or a connector. A method of assembling an electrical assembly may include soldering a first conductive resilient member and a second conductive resilient member of the connector to the circuit board, and/or disposing, after soldering the first and second conductive resilient members, the shunt busbar such that the first conductive resilient member and the second conductive resilient member are in electrical contact with the shunt busbar.

In embodiments, a method of operating an electrical assembly may include providing power from a power source to a shunt busbar, and/or measuring, via the controller, at least one of a voltage and a current of the shunt busbar via a first conductive resilient member and a second conductive resilient member of the connector that are: (i) disposed in electrical contact with respective portions of the shunt busbar, (ii) fixed to the circuit board, and (iii) connected, at least indirectly, to the controller.

The foregoing and other aspects, features, details, utilities, and/or advantages of embodiments of the present disclosure will be apparent from reading the following description, and from reviewing the accompanying drawings.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and are not restricted to the precise form and configuration shown in the drawings or disclosed in the following detailed description. Exemplary illustrations are described in detail by referring to the drawings as follows:

FIGS. 10A and 10B are block diagrams generally illustrating embodiments of electrical assemblies according to teachings of the present disclosure.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they are not intended to limit the present disclosure to these embodiments and/or examples. On the contrary, the present disclosure is intended to cover alternatives, modifications, and equivalents.

Figure 1A:
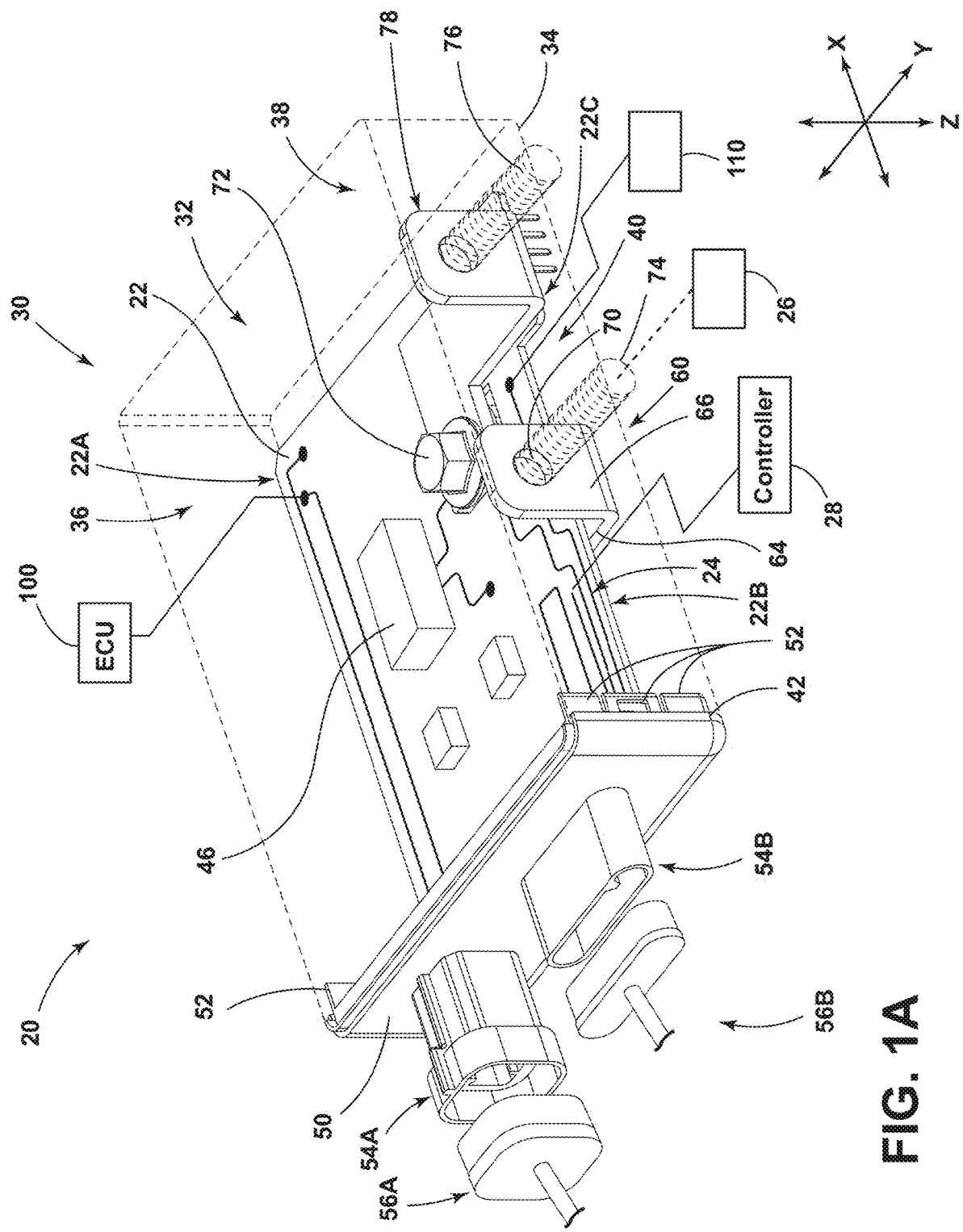
FIG. 1A is a perspective view generally illustrating portions of an embodiment of an electrical assembly according to teachings of the present disclosure.
Figure 1B:
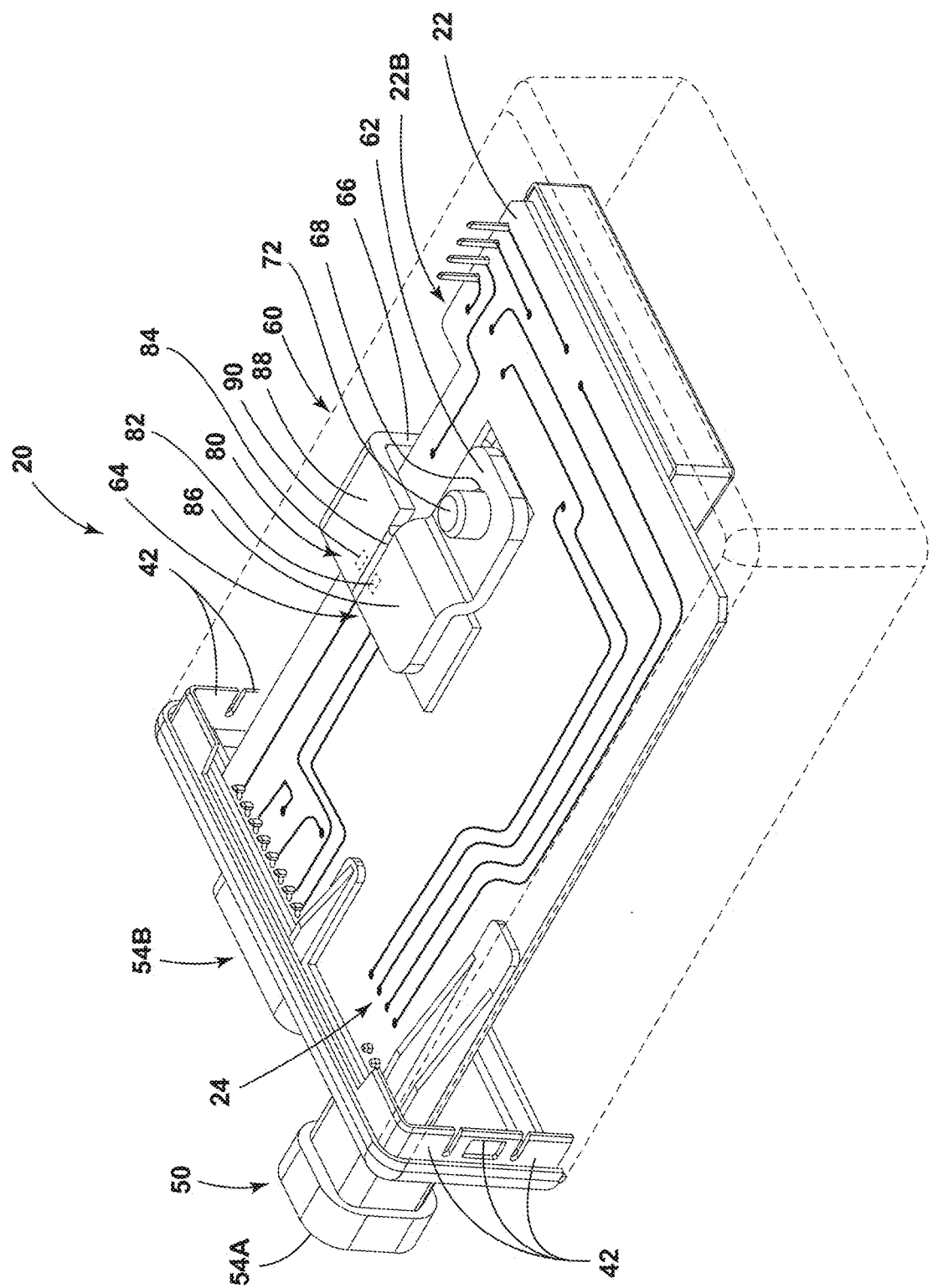
FIG. 1B is a perspective view generally illustrating portions of an embodiment of an electrical assembly according to teachings of the present disclosure.

In embodiments, such as generally illustrated in FIGS. 1A and 1B, an electrical assembly 20 may include a circuit board 22, a power source 26, a controller 28, and/or a shunt busbar 60. The shunt busbar 60 may be connected with the circuit board 22 via a connector 80 (see, e.g., FIGS. 1B and 7-9). The circuit board 22 may be electrically connected with the controller 28, and/or the circuit board 22 may be electrically connected with one or more of a variety of electrical components 46 (e.g., relays, fuses, busbars, and/or terminals). The connector 80 may not be fixed to the shunt busbar 60, and/or may be fixed to the circuit board 22. The electrical assembly 20 may, for example and without limitation, be configured for use in/with a vehicle 20A.

Figure 2:
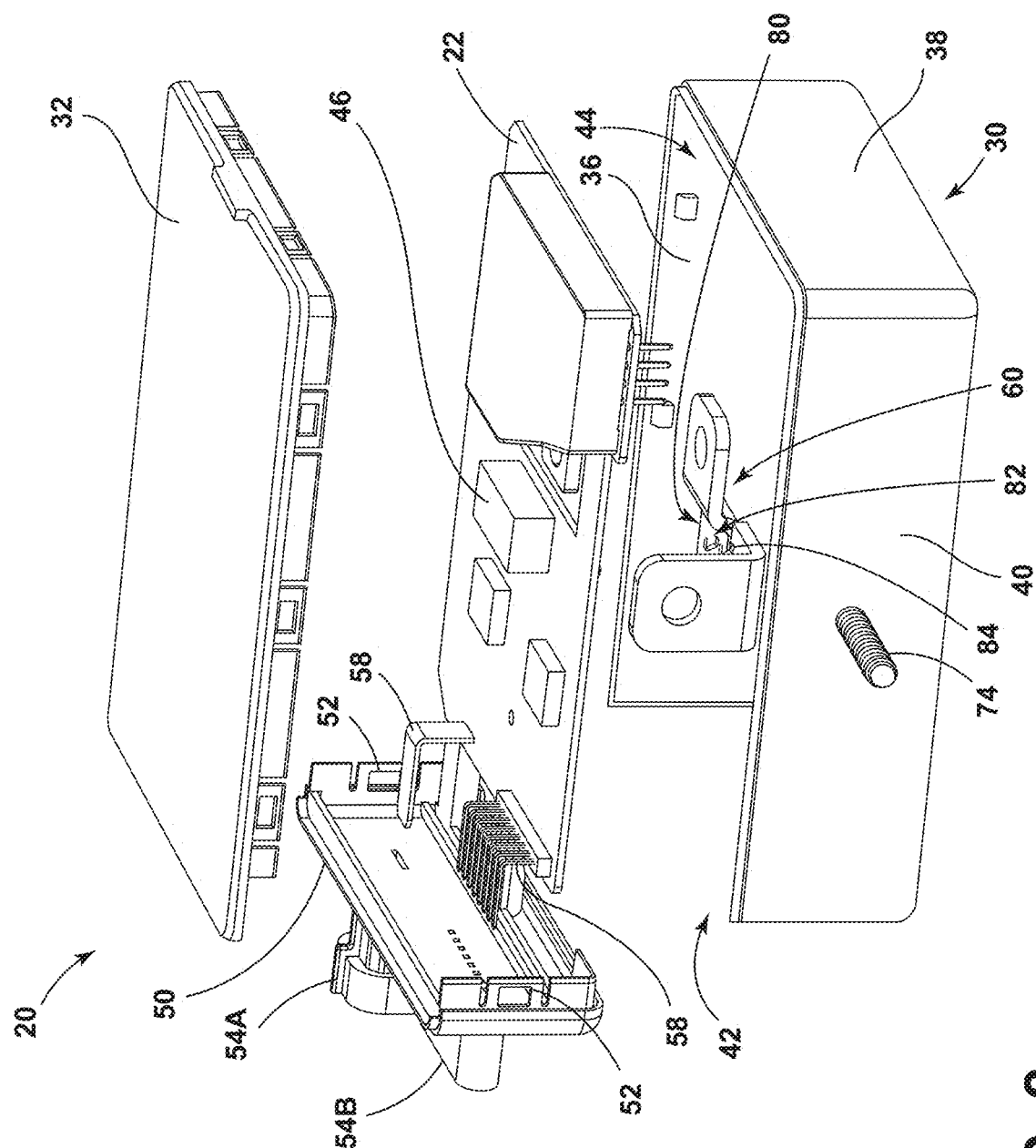
FIG. 2 is an exploded perspective view generally illustrating portions of an embodiment of an electrical assembly according to teachings of the present disclosure.
Figure 3:
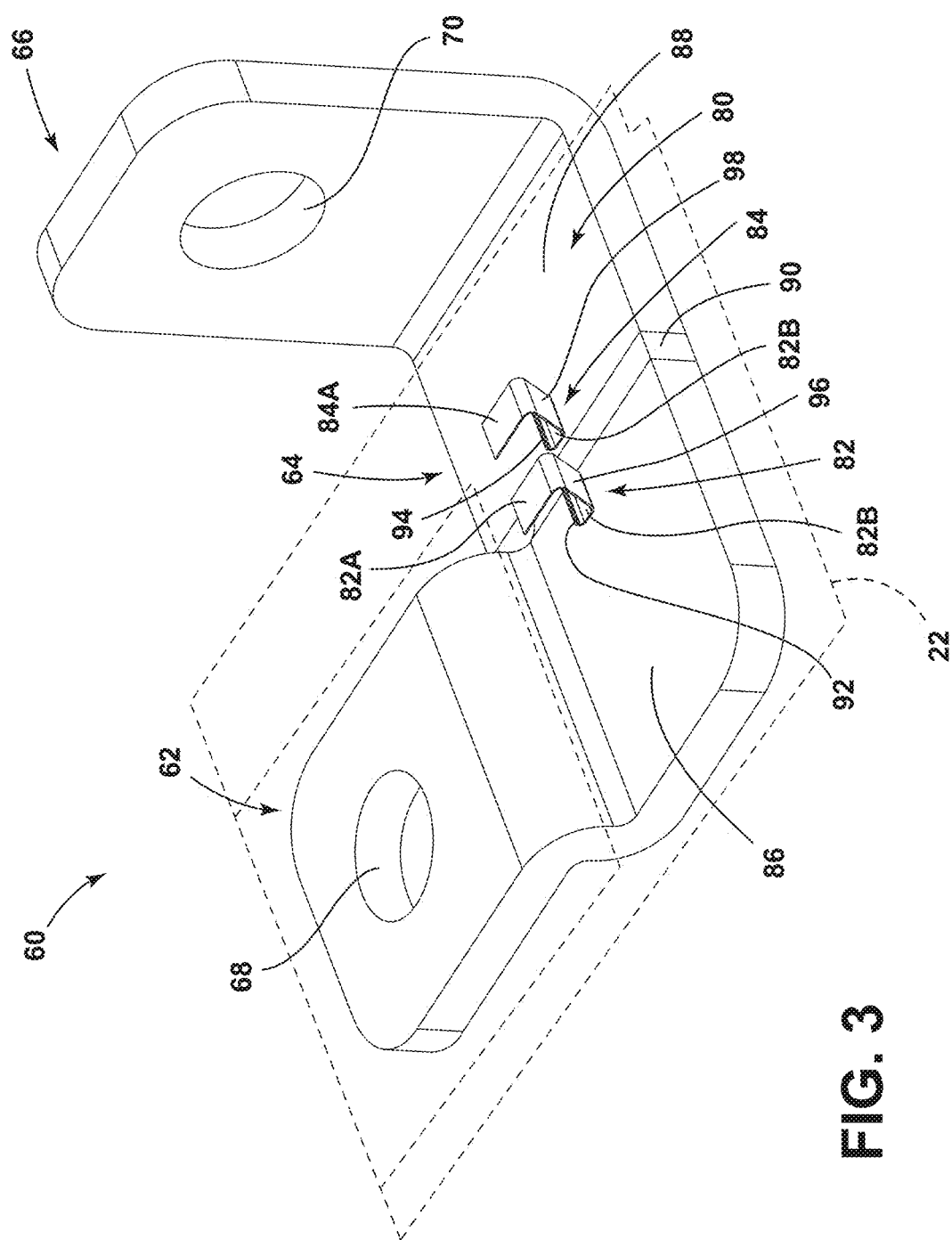
FIG. 3 is a perspective view generally illustrating embodiments of a shunt busbar, a circuit board, and a connector fixed to the circuit board, according to teachings of the present disclosure.
Figure 4:
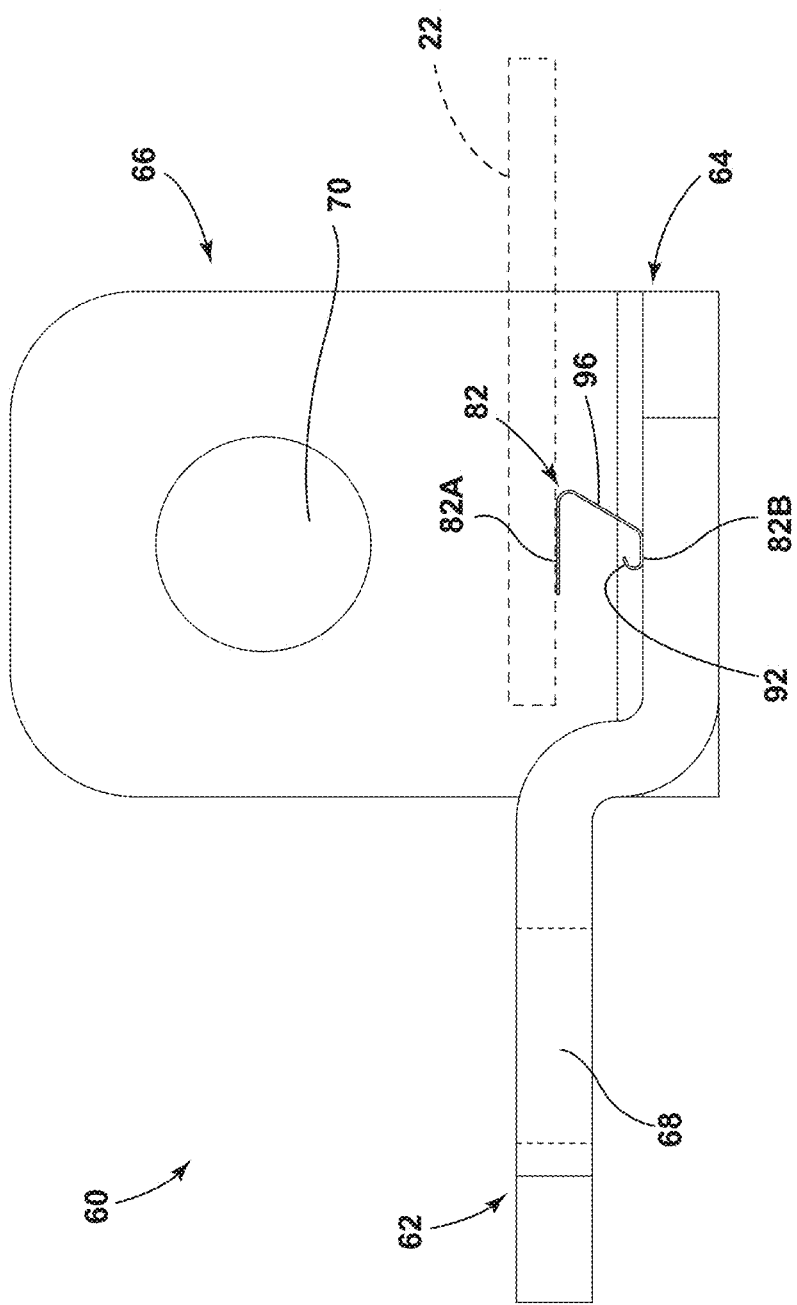
FIG. 4 is a side view generally illustrating embodiments of a shunt busbar, a circuit board, and a connector fixed to the circuit board according to teachings of the present disclosure.
Figure 5:
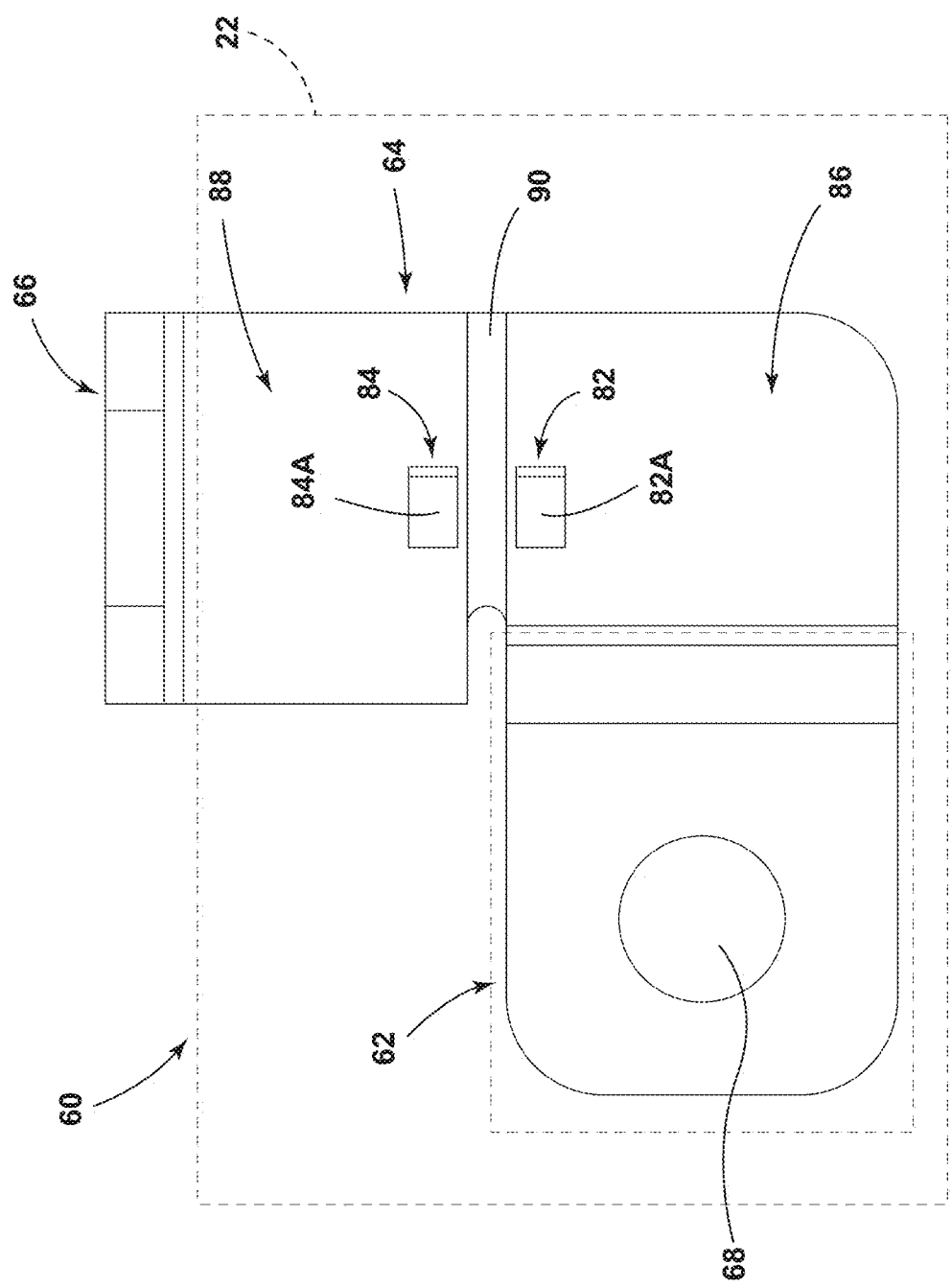
FIG. 5 is a top view generally illustrating embodiments of a shunt busbar, a circuit board, and a connector fixed to the circuit board according to teachings of the present disclosure.

With embodiments, such as generally illustrated in FIGS. 1A, 1B, and 2, an electrical assembly 20 may include a housing 30. The circuit board 22, the shunt busbar 60, the connector 80, and/or the controller 28 may be disposed substantially within the housing 30 and/or at least partially within the housing 30. The housing 30 may include one or more of a variety of shapes, sizes, configurations, and/or materials. For example and without limitation, the housing 30 may be generally rectangular, and/or may include a polymer/plastic material. The housing 30 may include a top 32, a bottom 34, a first side wall 36, a second side wall 38, and/or a third side wall 40 that may define an internal chamber 44. The housing 30 may include an aperture 42 that may be provided at an open side of the housing 30. The aperture 42 and/or the internal chamber 44 may be configured to receive the circuit board 22, the shunt busbar 60, the connector 80, and/or the controller 28, such as from a direction substantially parallel to an X-Y plane (e.g., a plane substantially parallel to the circuit board 22).

In embodiments, such as generally illustrated in FIGS. 1A, 1B, and 2, the electrical assembly 20 may include a connector interface 50 that may be connected (e.g., fixed) to the circuit board 22. The connector interface 50 may be configured to at least partially engage housing 30 via the aperture 42. For example and without limitation, the connector interface 50 may include one or more locking members 52 that may extend into and/or through the aperture 42 to connect the connector interface 50 with the housing 30. The locking members 52 may at least partially limit movement of the circuit board 22 and/or the connector interface 50 with respect to the housing 30. The connector interface 50 may include a first connector portion 54A and/or a second connector portion 54B. The first connector portion 54A and/or the second connector portion 54B may be configured to facilitate connection of electrical connectors 56A, 56B (e.g., of a wiring harness or bundle), which may have one or more electrical terminals, with the electrical assembly 20 and/or the connector interface 50, such as to electrically connect the one or more electrical terminals with the circuit board 22 and/or electrical components 46 that may be connected thereto. The connector interface 50 and/or the connector portions 54A, 54B, 56A, 56B may include and/or mechanically support one or more interface terminals 58 that may be connected (e.g., soldered) to the circuit board 22 (see, e.g., FIG. 2) and/or that may be configured for connection with electrical terminals of an electrical connector 56A, 56B. The interface terminals 58 may, for example and without limitation, include L-shaped configurations.

With embodiments, such as generally illustrated in FIGS. 1A, 1B, 2, 3, 4, and 5, a shunt busbar 60 may be electrically connected to the circuit board 22 via the connector 80. The shunt busbar 60 may include one or more of a variety of shapes, sizes, and/or configurations. For example and without limitation, the shunt busbar 60 may include a first portion 62, a second portion 64, and/or a third portion 66. The first portion 62 may be connected with the second portion 64, and/or the second portion 64 may be connected with the third portion 66. The first portion 62 and/or the second portion 64 may be generally planar, and/or the first portion 62 and/or the second portion 64 may extend substantially on the X-Y plane. The third portion 66 may be generally planar and/or may extend substantially on an X-Z plane. The first portion 62 and/or the second portion 64 may be substantially disposed on a second side 22B of the circuit board 22, and/or the third portion 66 may be substantially disposed on a first side 22A of the circuit board 22. The circuit board 22 may include an outer portion 22C, and/or the third portion 66 may be disposed substantially proximate the outer portion 22C (e.g., the third portion 66 may be disposed about a periphery of the circuit board 22). The third portion 66 may not be aligned in the Z-direction with the circuit board 22. The first portion 62 and/or the second portion 64 may be disposed substantially perpendicular to the third portion 66. The first portion 62 of the shunt busbar 60 may be disposed more proximate to the second side 22B of the circuit board 22 than the second portion 64 of the shunt busbar 60. The shunt busbar 60, the controller 28, and/or the circuit board 22 may be configured for a current of at least about 200 A (e.g., and/or up to about 400 A).

In embodiments, the shunt busbar 60 may include one or more apertures 68, 70. For example and without limitation, the first portion 62 of the shunt busbar 60 may include a first aperture 68, and/or the third portion 66 of the shunt busbar 60 may include a second aperture 70. Such as generally illustrated in FIGS. 1A and 1B, the first aperture 68 of the shunt busbar 60 may be configured to receive a first conductor 72. The first conductor 72 may be a bolt, terminal, and/or post. The second aperture 70 of the shunt busbar 60 may be configured to receive a second conductor 74. The second conductor 74 may be a bolt, terminal, and/or post. The first conductor 72 and/or the second conductor 74 may connect the shunt busbar 60 to an electrical component 46, such as a relay, fuse, an additional busbar, and/or an external cable connection. For example and without limitation, the first conductor 72 may be connected with a third conductor 76 via an additional busbar 78 (see, e.g., FIG. 1A). The third conductor 76 may, for example, include a bolt, terminal, and/or post. The second conductor 74 may mechanically connect the shunt busbar 60 to the housing 30. For example and without limitation, the second conductor 74 may provide mechanical support for the shunt busbar 60, such that the shunt busbar 60 may not be mechanically supported by the circuit board 22. The second conductor 74 and/or a side wall 36, 38, 40 (e.g., the third side wall 40) of the housing 30 may support the shunt busbar 60.

Figure 6B:
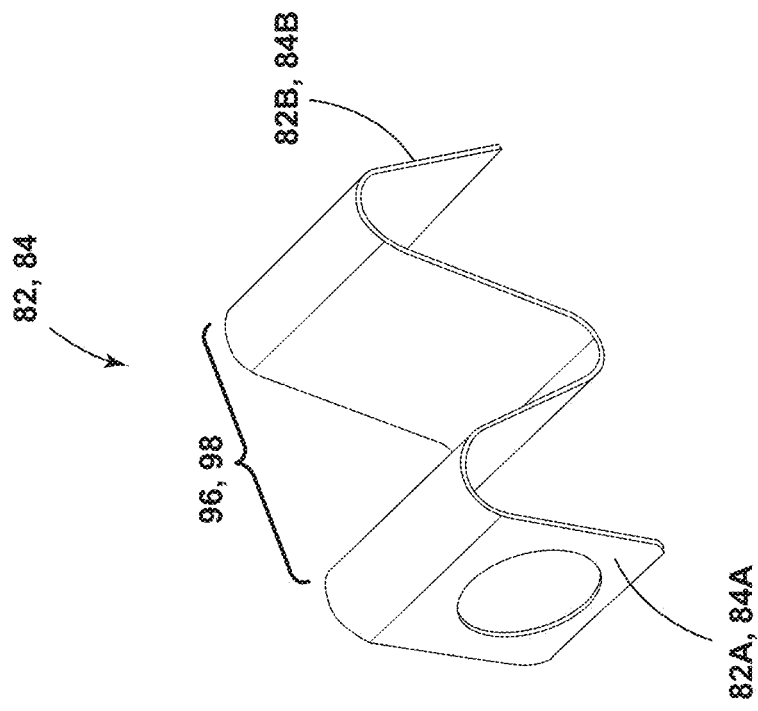
FIGS. 6A and 6B are perspective views generally illustrating embodiments of conductive resilient members according to teachings of the present disclosure.
Figure 6A:
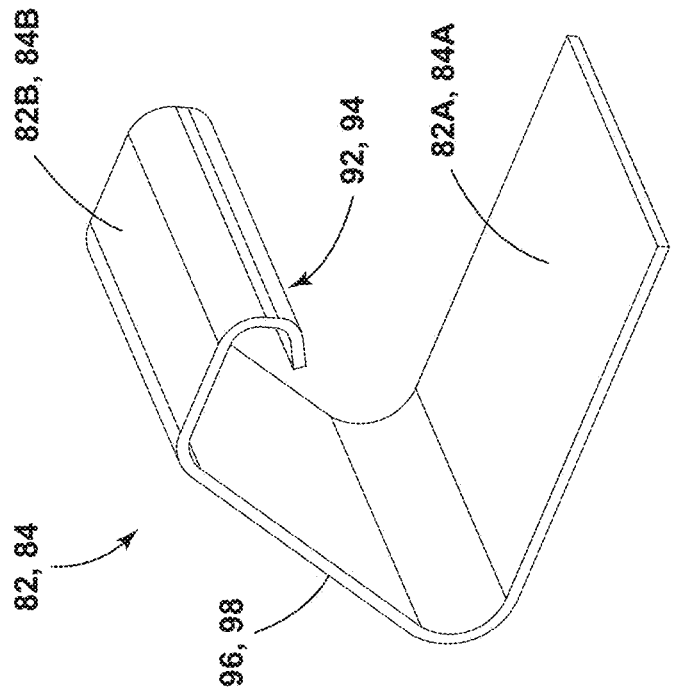
Figure 6E:
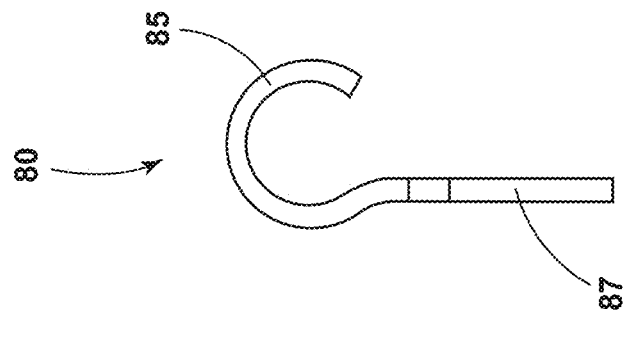
FIG. 6E is a side view generally illustrating an embodiment of a conductive resilient member according to teachings of the present disclosure.

With embodiments, such as generally illustrated in FIGS. 3, 4, 5, 6A, 6B, 6C, 6D, and 6E, an electrical assembly 20 may include a connector 80 that may be configured for connection with a shunt busbar 60. The connector 80 may be configured to electrically connect the shunt busbar 60 with the circuit board 22 (e.g., the controller 28). For example and without limitation, the first side 22A and/or the second side 22B of the circuit board 22 may include a plurality of traces 24 (e.g., conductive electrical paths). The connector 80 may connect the shunt busbar 60 to the traces 24 of the circuit board 22. The connector 80 may be connected (e.g., electrically contact) to the second portion 64 of the shunt busbar 60, and/or the connector 80 may be fixed (e.g., soldered with, press-fit with, inserted through/into via through-hole technology or THT, glued with conductive adhesive to, etc.) the circuit board 22. The connector 80 may be disposed substantially on a surface of the circuit board 22 (e.g., surface mounted), such as the second side 22B of the circuit board 22 (see, e.g., FIGS. 6A-6D). Additionally or alternatively, the connector 80 may be disposed in or through the circuit board 22 (e.g., may have a THT-compatible structure with pins/protrusions extending into the circuit board 22, such as shown in FIG. 6E).

In embodiments, such as generally illustrated in FIGS. 3, 4, 5, 6A, 6B, 6C, 6D, and 6E, a connector 80 may include a first conductive resilient member 82 and/or a second conductive resilient member 84. The conductive resilient members 82, 84 may electrically connect the shunt busbar 60 with the circuit board 22. The conductive resilient members 82, 84 may include one or more of a variety of shapes, sizes, and/or configurations. For example and without limitation, the conductive resilient members 82, 84 may be generally C-shaped (see, e.g., FIG. 6A), N-shaped, W-shaped (see, e.g., FIG. 6B), and/or curved/hook-shaped (see, e.g., FIG. 6E). The conductive resilient members 82, 84 may include and/or provide a spring force (e.g., the conductive resilient members 82, 84 may be conductive spring members). The conductive resilient members 82, 84 may be configured to flex, compress, and/or deform as the distance between the second side 22B of the circuit board 22 and the second portion 64 of the shunt busbar 60 increases and/or decreases, such as to maintain electrical connections between the circuit board 22 and the shunt busbar 60 (e.g., during assembly, operation, and/or use of the electrical assembly 20).

Figure 6D:
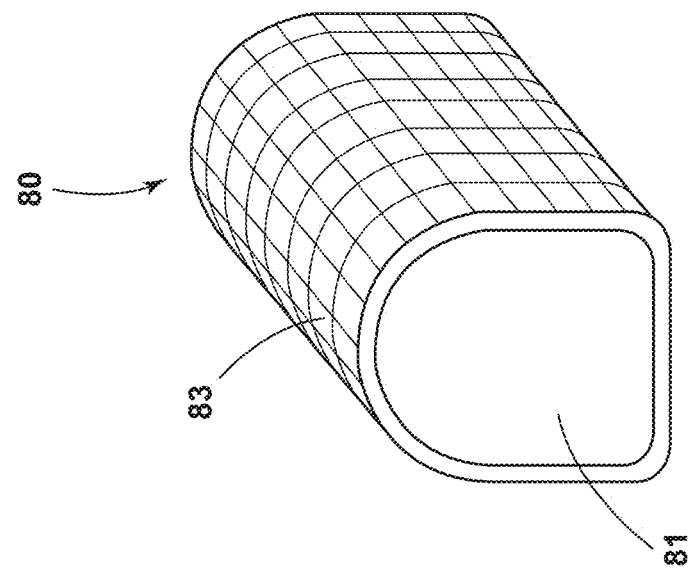
FIGS. 6C and 6D are perspective views generally illustrating embodiments of conductive resilient members according to teachings of the present disclosure.
Figure 6C:
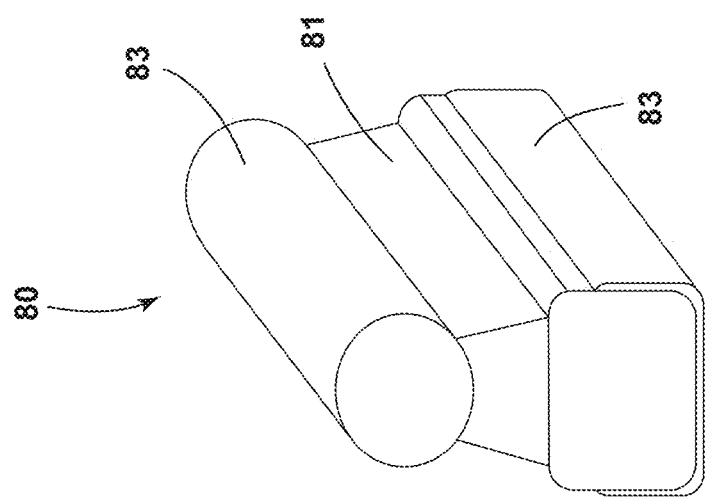

With embodiments, such as generally illustrated in FIGS. 6C and 6D, a connector 80 may include a foam portion 81 and/or one or more conductive portions 83. The foam portion 81 may include one or more of variety of shapes, sizes, materials, and/or configurations. For example and without limitation, the foam portion 81 may be rectangular, triangular, and/or rounded. The foam portion 81 may include a metallized/conductive foam material. The foam portion 81 may be configured to flex, deform, and/or compress due to relative movement between the circuit board 22 and the shunt busbar 60. The conductive portions 83 may provide an electrical path between the shunt busbar 60, the foam portion 81, and the circuit board 22. The conductive portions 83 may include one or more of a variety of shapes, sizes, materials, and/or configurations. For example and without limitation, the conductive portions 83 may be a coating applied to an exterior of the foam portion 81 (e.g., as shown in FIG. 6C). Additionally or alternatively, such as generally illustrated in FIG. 6D, the conductive portions 83 may be configured as a metal mesh-like sheath (e.g., mesh and/or foil similar to cable shielding or EMC gaskets). The conductive portions 83 may, for example, be soldered and/or glued with a conductive adhesive to the circuit board 22.

In embodiments, such as generally illustrated in FIG. 6E, a connector 80 may be configured as a THT terminal. The connector 80 may include a hook-shaped and/or spring-like curved portion 85. The curved portion 85 may be configured to contact the shunt busbar 60, and/or the curved portion 85 may flex, bend, and/or compress due to relative movement between the circuit board 22 and the shunt busbar 60 (e.g., to maintain an electrical connection therebetween). The connector 80 may include a base portion 87 that may extend into and/or through the circuit board 22 (e.g., soldered on an opposite side).

With embodiments, such as generally illustrated in FIGS. 3, 5, 7, and 9, the second portion 64 of the shunt busbar 60 may include a first conductive segment 86 and/or a second conductive segment 88. The first conductive segment 86 may be connected with the first portion 62 of the shunt busbar 60, and/or the second conductive segment 88 may be connected with the third portion 66 of the shunt busbar 60. The first conductive resilient member 82 may be connected to the first conductive segment 86, and/or the second conductive resilient member 84 may be connected to the second conductive segment 88. The shunt busbar 60 may include a shunt portion 90 that may be disposed between the first conductive segment 86 and the second conductive segment 88. The shunt portion 90 may be disposed between the first conductive resilient member 82 and/or the second conductive resilient member 84. The shunt portion 90 may include a known and/or determined resistance which the controller 28 may be configured to use to determine a voltage drop (and/or current) between the first conductive resilient member 82 and the second conductive resilient member 84 (e.g., the shunt portion 90 may act, at least in part, as a current sensor).

In embodiments, such as generally illustrated in FIGS. 3-6B and 7-9, the conductive resilient members 82, 84 may include a first contact surface 82A, 84A and/or a second contact surface 82B, 84B. The first contact surfaces 82A, 84A may be disposed on a first side of the conductive resilient members 82, 84 and/or the second contact surfaces 82B, 84B may be disposed on a second side of the conductive resilient members 82, 84. The contact surfaces 82A, 82B, 84A, 84B, may include one or more of a variety of shapes, sizes, and/or configurations. For example and without limitation, the contact surfaces 82A, 82B, 84A, 84B may be substantially planar, such as to increase the conductivity and/or maximize surface contact area between the contact surfaces 82A, 82B, 84A, 84B and the circuit board 22 and/or the shunt busbar 60. The first contact surfaces 82A, 84A may be fixed (e.g., solder, conductive glue, press-fit, THT, etc.) to the second side 22B of the circuit board 22. The first contact surfaces 82A, 84A may be electrically connected and/or fixed to one or more traces 24 of the circuit board 22. The traces 24 may connect the first contact surfaces 82A, 84A with an electronic control unit (ECU) 100 and/or the controller 28. For example and without limitation, the controller 28 may be disposed on the circuit board 22 and may be directly/physically connected to the ECU 100, and/or or the controller 28 may be wirelessly connected with the ECU 100.

With embodiments, the second contact surfaces 82B, 84B may include one or more of a variety of shapes, sizes, and/or configurations. For example and without limitation, the second contact surfaces 82B, 84B may include a curved/rounded portions 92, 94. The curved portions 92, 94 may be disposed at an end of the second side of the conductive resilient members 82, 84. The curved portions 92, 94 may at least partially limit unintended engagement (e.g., catching) of the second contact surfaces 82B, 84B with the shunt busbar 60. The second contact surfaces 82B, 84B may not be fixed to the shunt busbar 60. As the circuit board 22 may be disposed proximate the shunt busbar 60, the second contact surfaces 82B, 84B may contact the second portion 64 of the shunt busbar 60 (e.g., the first conductive resilient member 82 may contact the first conductive segment 86 of the second portion 64 of the shunt busbar 60, and/or the second conductive resilient member 84 may contact the second conductive segment 88 of the second portion 64 of the shunt busbar 60).

Figure 7:
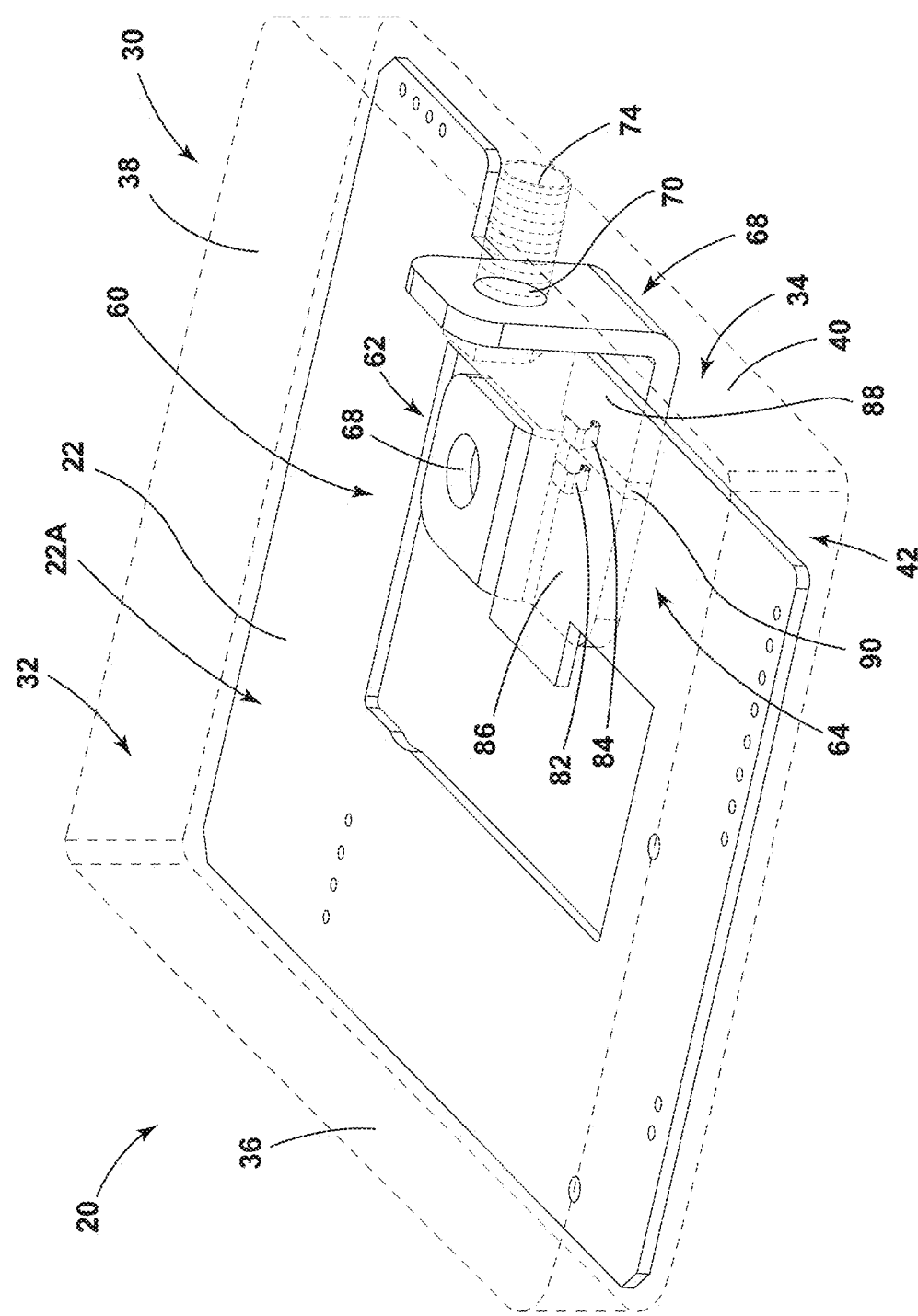
FIG. 7 is a perspective view generally illustrating portions of an embodiment of an electrical assembly according to teachings of the present disclosure.
Figure 8:
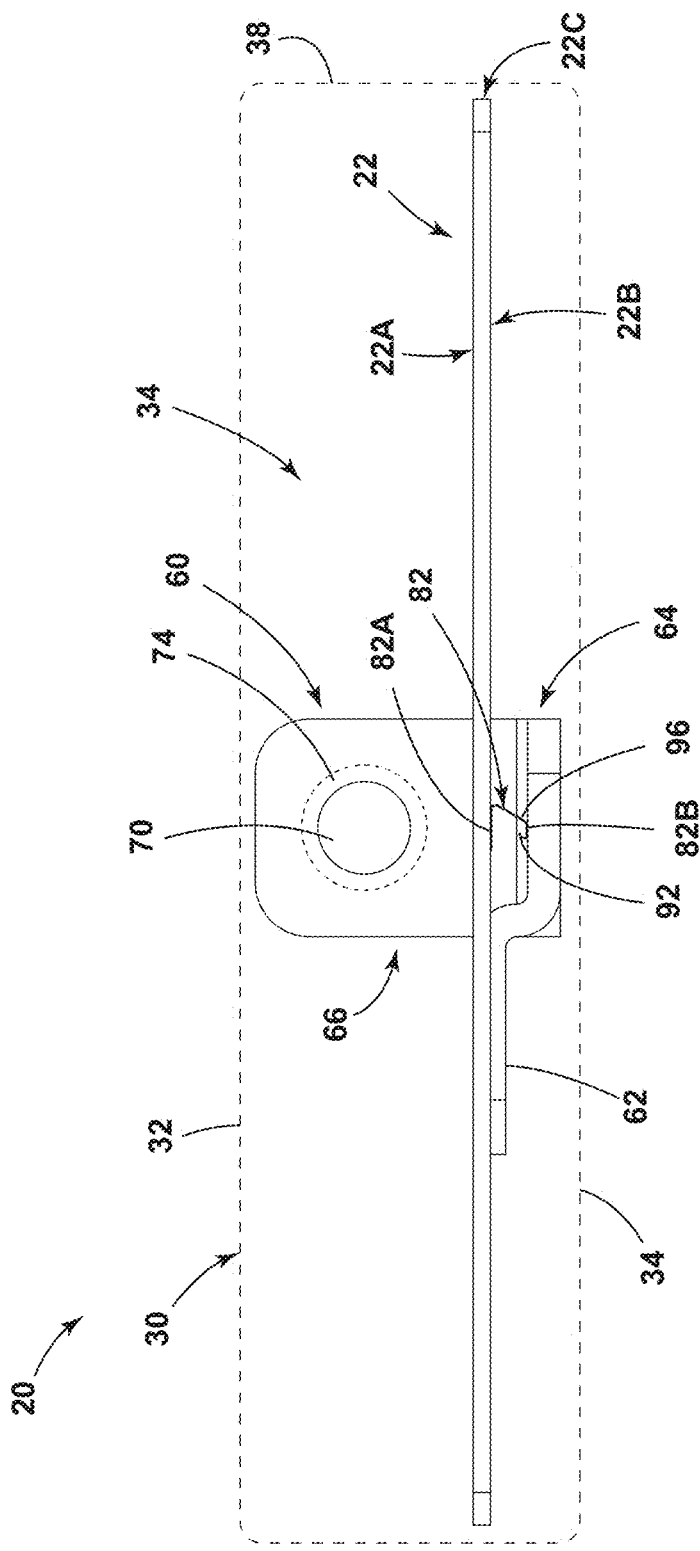
FIG. 8 is a side view generally illustrating portions of an embodiment of an electrical assembly according to teachings of the present disclosure.
Figure 9:
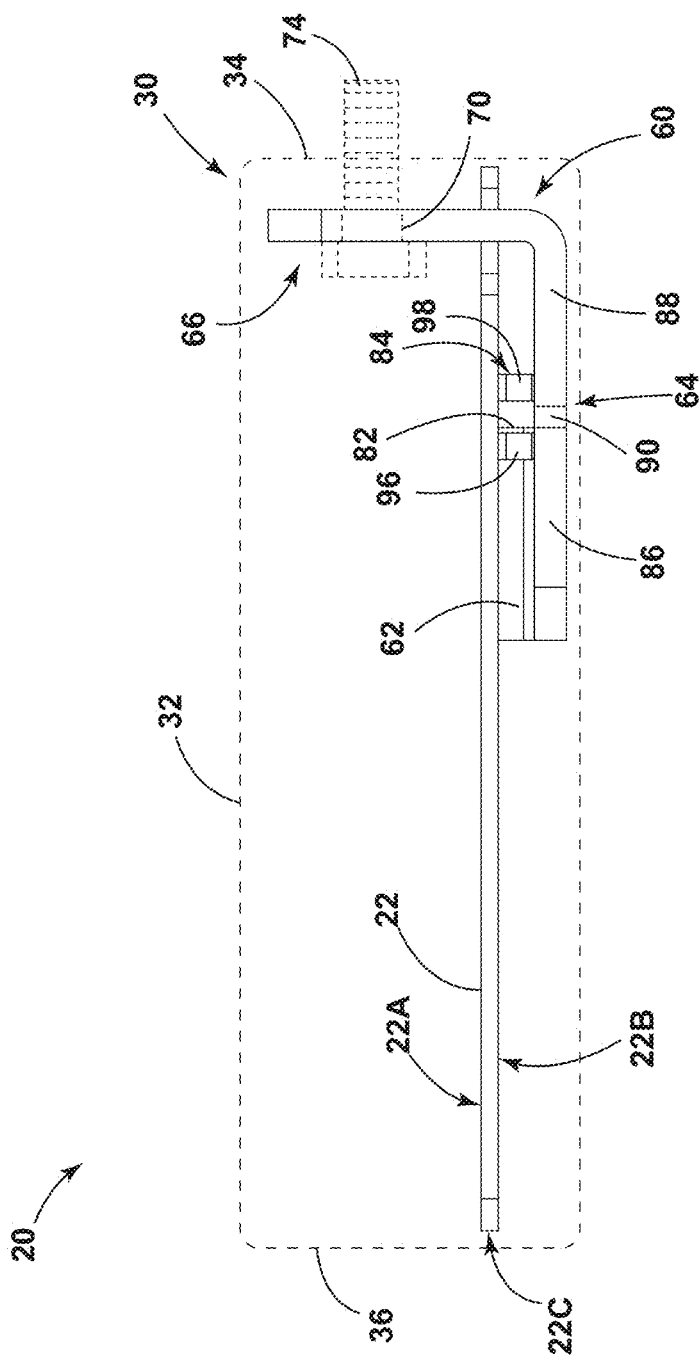
FIG. 9 is a side view generally illustrating portions of an embodiment of an electrical assembly according to teachings of the present disclosure.

In embodiments, such as generally illustrated in FIGS. 7, 8, and 9, the first contact surfaces 82A, 84A and/or the second contact surfaces 82B, 84B may be connected via a spring segment 96, 98. The first conductive resilient member 82 may include a first spring segment 96 and/or the second conductive resilient member 84 may include a second spring segment 98. The spring segments 96, 98 may be configured to flex, bend, and/or compress due to relative movement between the circuit board 22 and the shunt busbar 60. The spring segments 96, 98 may include one or more bends and/or curves to produce a spring force. The spring force may correspond to the distance between the second side 22B of the circuit board 22 and the second portion 64 of the shunt busbar 60. For example and without limitation, the conductive resilient members 82, 84 may include a stronger spring force for a lesser distance between the circuit board 22 and the shunt busbar 60, and/or the conductive resilient members 82, 84 may include a weaker spring force for a greater distance between the circuit board 22 and the shunt busbar 60.

With embodiments, such as generally illustrated in FIGS. 10A and 10B, the connector 80 may be connected to one or more electrical traces 24 of the circuit board 22 (e.g., on the second side 22B). The electrical assembly 20 may include a differential amplifier 110. The ECU 100 may be configured to selectively connect the power source 26 to one or more electrical loads 112 (e.g., vehicle loads) via the shunt busbar 60. The differential amplifier 110 may be configured to increase the signal received by the connector 80 (e.g., from the shunt busbar 60) such that the controller 28 may determine the voltage drop (and/or the current) between the first conductive resilient member 82 and/or the second conductive resilient member 84. The differential amplifier 110 may be electrically connected with the circuit board 22. The differential amplifier 110 may be electrically connected to the controller 28, the shunt busbar 60, and/or the ECU 100. For example and without limitation, the differential amplifier 110 may receive a signal from the first conductive resilient member 82 and the second conductive resilient member 84, and the differential amplifier 110 may transmit a signal to the controller 28 and/or the ECU 100. In embodiments, the differential amplifier 110 may be included as part of the controller 28 and/or the differential amplifier 110 may be connected to the circuit board 22. The controller 28 may be configured to determine the current and/or voltage across the shunt busbar 60 via the connector 80 and a signal/information received from the differential amplifier 110. The controller 28 may include an analog-to-digital (ADC) converter that may be configured to convert an analog signal, such as from the conductive resilient members 82, 84 and/or the amplifier 110, into a digital signal that may be processed and/or communicated by the controller 28, such as to the ECU 100.

Figure 11:
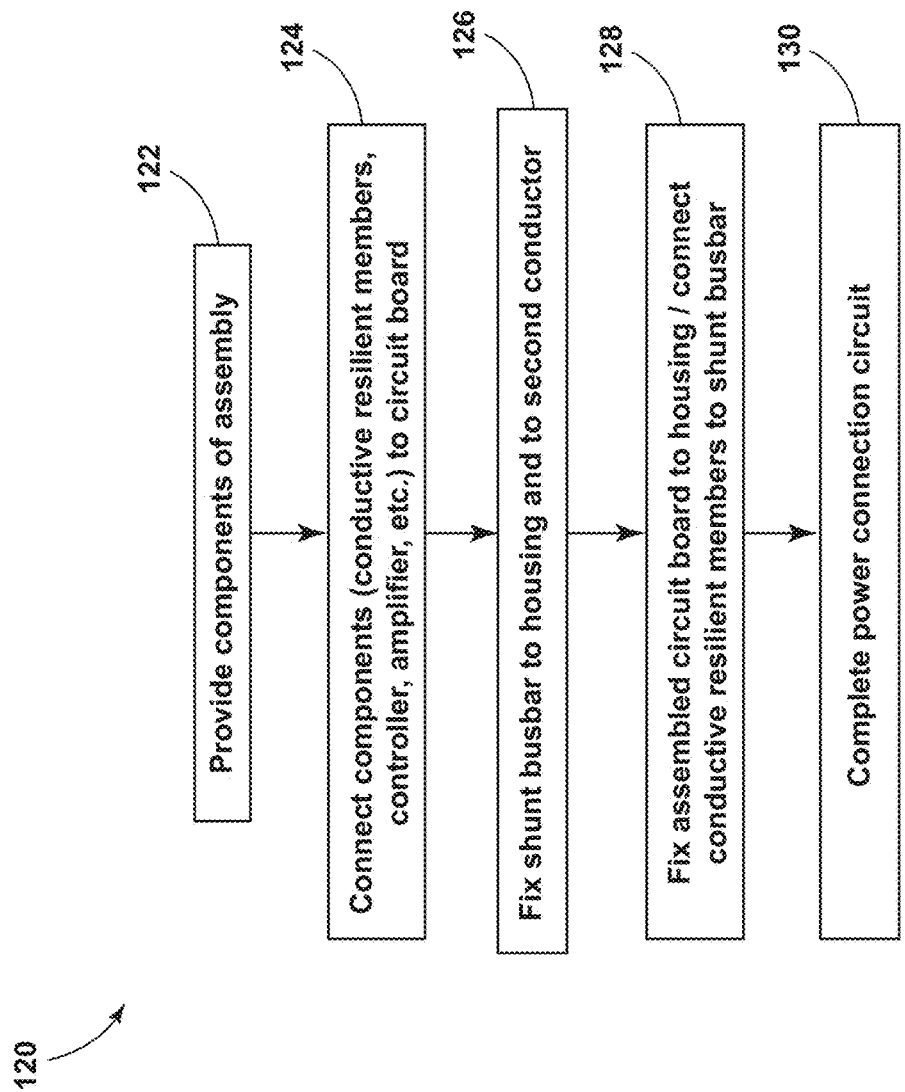
FIG. 11 is a flowchart generally illustrating a method of assembling an electrical assembly according to teachings of the present disclosure.

With embodiments, such as generally illustrated in FIG. 11, a method 120 of assembling an electrical assembly 20 may include providing a circuit board 22, a housing 30, a shunt busbar 60, a controller 28, and/or a connector 80 (step 122). The connector 80 may include a first conductive resilient member 82 and/or a second conductive resilient member 84. The method 120 may include connecting (e.g., fixing, soldering, positively engaging, conductively gluing, press-fitting, etc.) the first conductive resilient member 82, the second conductive resilient member 84, and/or other electrical components 46 (e.g., controllers, amplifiers, relays, etc.) to the circuit board 22 (step 124). The first conductive resilient member 82 and/or the second conductive resilient member 84 may not be fixed (e.g., soldered, fixed, positively engaged, etc.) with the shunt busbar 60. The method 120 may include fixing the shunt busbar 60 with the housing 30 and/or with the second conductor 74 (step 126). Fixing the shunt busbar 60 with the housing 30 may, for example, include inserting a conductor/fastener (e.g., the second conductor 74) through the second aperture 70 of the shunt busbar 60 and/or mechanically retaining the shunt busbar 60 within the housing 30 via the second conductor 74 and/or a nut that may be associated therewith. The method 120 may include fixing the shunt busbar 60 with the housing 30 separately from fixing the circuit board 22 with the housing 30 (e.g., the shunt busbar 60 may be fixed with the housing 30 via a different/separate connection than the manner in which the circuit board 22 may be fixed to the housing 30). The method 120 may include fixing the assembled circuit board 22 to the housing 30 (step 128). The method 120 may include completing a power connection between the circuit board 22, the shunt busbar 60, the second conductor 74, and/or the third conductor 76 (step 130).

Embodiments of electrical assemblies 20 may be more efficient to assemble than other designs. For example and without limitation, the first and second conductive resilient members 82, 84 may not be fixed to the shunt busbar 60, which may eliminate one or more assembly steps and/or may allow for a less complex shunt busbar design (e.g., the shunt busbar 60 may not include pins or other formations that extend into or are fixed to the circuit board 22). For designs in which a busbar is fixed to a circuit board via pins, the process of adding pins to the busbar and/or the process of inserting pins of the busbar into the circuit board and/or soldering the pins to the circuit board may be complicated/difficult, such as because of small tolerances and/or inaccessibility (e.g., it may difficult to solder the pins between the busbar and the circuit board). In contrast, with embodiments of electrical assemblies 20, the first and second conductive resilient members 82, 84 may be soldered to the circuit board 22 before connection with the shunt busbar 60, so the shunt busbar 60 may not restrict or complicate the soldering process, and the shunt busbar 60 may be fixed to the housing 30 to maintain its position relative to the circuit board 22, which may also be fixed to the housing 30.

Figure 12:
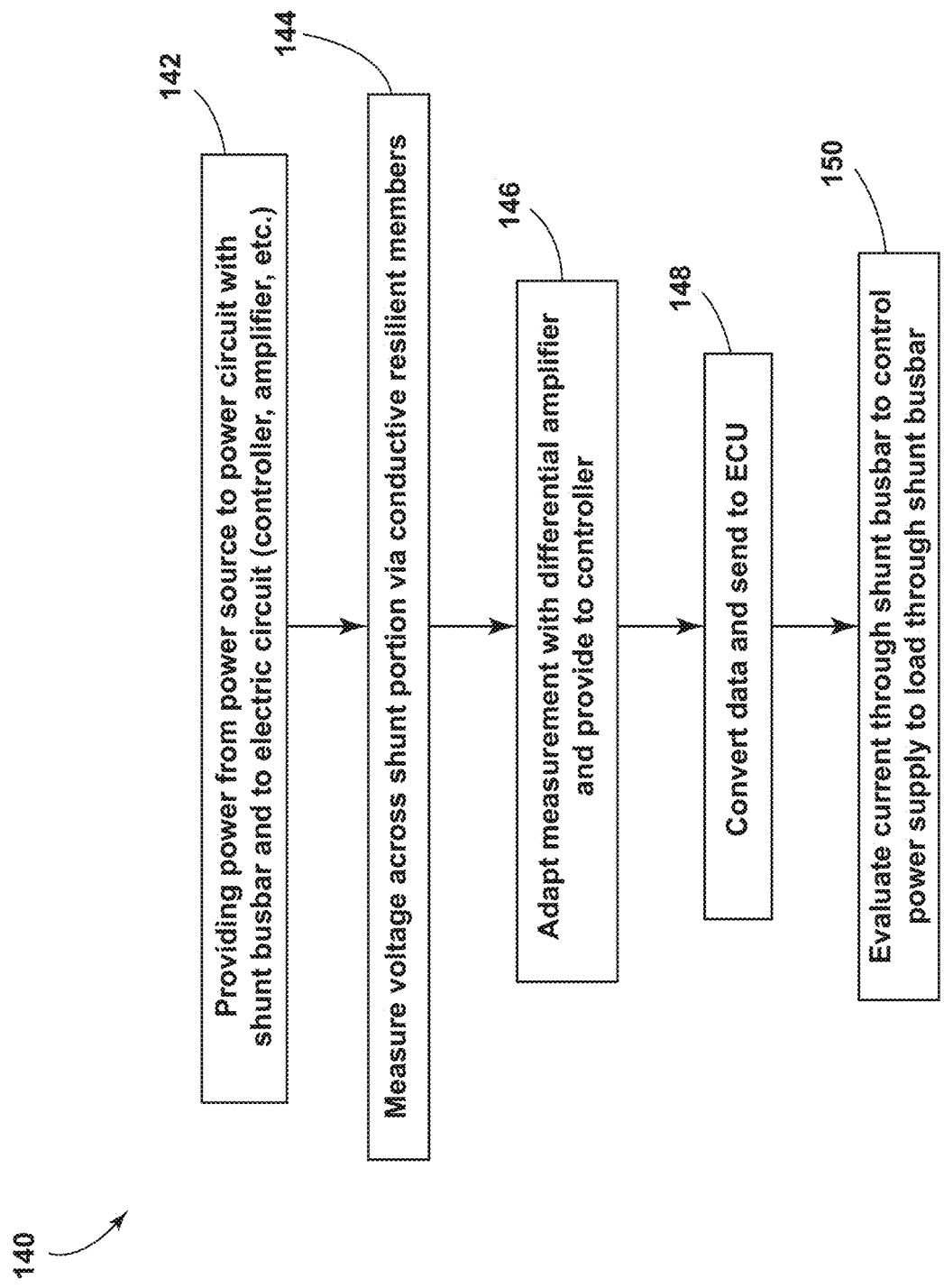
FIG. 12 is a flowchart generally illustrating a method of operating an electrical assembly according to teachings of the present disclosure.

In embodiments, such as generally illustrated in FIG. 12, a method 140 of operating the electrical assembly 20 may include providing power from a power source 26 to the circuit board 22 (e.g., a power circuit including controllers, relays, amplifiers, etc.) via a shunt busbar 60 (step 142). The method 140 may include determining an electrical current and/or voltage across the shunt portion 90 of the shunt busbar 60 via the first conductive resilient member 82 and the second conductive resilient member 84 (step 144). The method 140 may include adapting received voltage/current measurements via the differential amplifier 110 and providing the resulting measurements to a controller 28 and/or the ECU 100 (step 146). The differential amplifier 110 may amplify a signal received from the first conductive resilient member 82 and/or the second conductive resilient member 84. The method 140 may include the controller 28 converting the measurements (e.g., from the differential amplifier 110) and sending the measurements to the ECU 100 (step 148). The method 140 may include the ECU 146 evaluating current measurements from the shunt busbar 60 to control power supplied to the load 112 via the shunt busbar 60 (step 150). The shunt busbar 60 may be configured for a current of at least about 200 A. For example and without limitation, the shunt busbar 60 may be configured for currents between about 200 A and 400 A.

Embodiments of electrical assemblies 20 may include a plurality of shunt busbars 60 and/or a plurality of connectors 80.

In embodiments, a controller (e.g., controller 28) and/or an ECU (e.g., ECU 100) may include an electronic controller and/or include an electronic processor, such as a programmable microprocessor and/or microcontroller. In embodiments, a controller or ECU may include, for example, an application specific integrated circuit (ASIC). A controller or ECU may include a central processing unit (CPU), a memory (e.g., a non-transitory computer-readable storage medium), and/or an input/output (I/O) interface. A controller or ECU may be configured to perform various functions, including those described in greater detail herein, with appropriate programming instructions and/or code embodied in software, hardware, and/or other medium. In embodiments, a controller or ECU may include a plurality of controllers. In embodiments, a controller or ECU may be connected to a display, such as a touchscreen display.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are intended to be inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

It is intended that all matter contained in the above description or shown in the accompanying drawings shall be interpreted as illustrative only and not limiting. Changes in detail or structure may be made without departing from the present disclosure.

It should be understood that a controller (e.g., controller 28), an electronic control unit (e.g., ECU 100), a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. An electrical assembly, comprising: a circuit board; a shunt busbar; a connector including a first conductive resilient member and a second conductive resilient member; and a controller; wherein the first conductive resilient member and the second conductive resilient member are disposed substantially between the circuit board and the shunt busbar; and the first conductive resilient member and the second conductive resilient member electrically connect the controller with the shunt busbar; wherein the shunt busbar includes a first conductive segment, a second conductive segment, and a shunt portion; the shunt portion is disposed between the first conductive segment and the second conductive segment; and the first conductive resilient member is connected to the first conductive segment, and the second conductive resilient member is connected to the second conductive segment to facilitate sensing a voltage drop across the shunt portion.

2. The electrical assembly of claim 1, wherein the first conductive resilient member and the second conductive resilient member are not fixed to the shunt busbar.

3. The electrical assembly of claim 1, including a housing; wherein the circuit board, the shunt busbar, and the connector are disposed substantially within the housing; and
the shunt busbar is mechanically connected to the housing.

4. The electrical assembly of claim 3, wherein the shunt busbar is fixed to the housing via a conductive fastener.

5. The electrical assembly of claim 1, wherein at least one of the first conductive resilient member and the second conductive resilient member extends through the circuit board.

6. The electrical assembly of claim 1, wherein the shunt busbar is configured for a current of at least about 200 A.

7. The electrical assembly of claim 1, wherein the controller includes a differential amplifier.

8. The electrical assembly of claim 7, wherein the controller is configured to determine at least one of a current and a voltage of the shunt busbar via the differential amplifier.

9. The electrical assembly of claim 1, wherein at least one of the first conductive resilient member and the second conductive resilient member is substantially C-shaped.

10. The electrical assembly of claim 1, wherein at least one of the first conductive resilient member and the second conductive resilient member includes conductive foam.

11. The electrical assembly of claim 1, wherein
the first conductive resilient member and the second conductive resilient member each include a first contact portion and a second contact portion;
the first contact portions of the first and second conductive resilient members are fixed to the circuit board; and
the second contact portions of the first and second conductive resilient members are in contact with and not fixed to or positively engaged with the shunt busbar.

12. A vehicle, comprising:
the electrical assembly of claim 1; and
a power source,
wherein the power source is connected to the shunt busbar; and
the electrical assembly is configured to selectively provide power to one or more electrical loads of the vehicle.

13. A method of assembling the electrical assembly of claim 1, the method comprising:
soldering the first conductive resilient member and the second conductive resilient member of the connector to the circuit board; and
disposing, after soldering the first and second conductive resilient members, the shunt busbar such that the first conductive resilient member and the second conductive resilient member are in contact with the shunt busbar.

14. The method of claim 13, wherein
the first conductive resilient member and the second conductive resilient member are not fixed to the shunt busbar; and
the first conductive resilient member and the second conductive resilient member are connected with the controller via the circuit board.

15. The method of claim 14, including fixing the shunt busbar to a housing separately from fixing the circuit board to the housing.

16. A method of operating the electrical assembly of claim 1, the method comprising:
providing power from a power source to the shunt busbar; and
measuring, with the controller, at least one of a voltage and a current of the shunt busbar via the first conductive resilient member and the second conductive resilient member of the connector that are:
(i) disposed in electrical contact with respective portions of the shunt busbar,
(ii) fixed to the circuit board, and
(iii) connected, at least indirectly, to the controller.

17. The method of claim 16, wherein measuring the at least one of the voltage and the current includes amplifying, via a differential amplifier connected with the first conductive resilient member and the second conductive resilient member, a signal from the first and second conductive resilient members and providing an amplified version of the signal to the controller.

18. The method of claim 16, including an electronic control unit (ECU) selectively connecting the power source to one or more electrical components via the shunt busbar according to the at least one of the voltage and the current.

19. The method of claim 16, wherein
the shunt busbar is configured for current of at least about 200 A;
the shunt busbar includes a first conductive segment, a second conductive segment, and a shunt portion disposed between the first conductive segment and the second conductive segment;
the shunt busbar is disposed such that the first conductive resilient member is in electrical contact but not fixed or positively engaged with the first conductive segment; and
the shunt busbar is disposed such that the second conductive resilient member is in electrical contact but not fixed or positively engaged with the second conductive segment.

* * * * *